US007755828B2

(12) United States Patent
Currie et al.

(10) Patent No.: US 7,755,828 B2
(45) Date of Patent: Jul. 13, 2010

(54) METHOD FOR OPTICAL CONTROL OF MICROWAVE PHASE

(75) Inventors: Marc Currie, Gaithersburg, MD (US); Igor Vurgaftman, Odenton, MD (US); Janet W Lou, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 170 days.

(21) Appl. No.: 11/956,626

(22) Filed: Dec. 14, 2007

(65) Prior Publication Data

US 2008/0278794 A1 Nov. 13, 2008

Related U.S. Application Data

(60) Provisional application No. 60/910,230, filed on Apr. 5, 2007.

(51) Int. Cl.
*G02F 1/01* (2006.01)
(52) U.S. Cl. ...................................................... 359/279
(58) Field of Classification Search ................. 359/279, 359/278, 254, 900; 356/484
See application file for complete search history.

(56) References Cited

U.S. PATENT DOCUMENTS

| | | | |
|---|---|---|---|
| 6,337,660 B1 | 1/2002 | Esman et al. | |
| 6,476,959 B2* | 11/2002 | Yao | 359/334 |
| 6,661,377 B2* | 12/2003 | Lee et al. | 342/375 |
| 6,766,070 B2* | 7/2004 | Williams et al. | 385/3 |
| 6,963,442 B2* | 11/2005 | Yap et al. | 359/326 |
| 7,079,718 B2 | 7/2006 | Welch et al. | |
| 7,092,589 B2 | 8/2006 | Kish, Jr. et al. | |
| 2007/0041021 A1* | 2/2007 | Dorrer | 356/484 |

OTHER PUBLICATIONS

Williams, et al.; "High-saturation-intensity in GaAs/InP PIN waveguide photodetector," Proc. SPIE vol. 2155, p. 90-97, Jun. 1994-Abstract.
Williams, et al.; "Photodetector nonlinearity limitations on a high-dynamic range 3GHz fiber optic link," J. Lightwave Technol., 16, 192-199, 1998.
Frankel et al.; "True time-delay fiber-optic control of an ultrawideband array transmitter/receiver with multibeam capability," IEEE Trans. Microw. TT 43, 2387-2394, 1995.
Currie; "Optical Quantization of Microwave signals via distributed phase modulation," J. Lightwave Technol. 23, 827-833, 2005.
Currie et al.; "Microwave Phase Retardation in Saturated InGaAs Photodetectors," IEEE Photon. Tech. Lett., 18, pp. 1433-1435, 2006.

(Continued)

*Primary Examiner*—Timothy J Thompson
*Assistant Examiner*—Tuyen Q Tra
(74) *Attorney, Agent, or Firm*—Amy L. Ressing; Sally A. Ferrett

(57) ABSTRACT

A method and system for modifying the detected phase of a signal by driving a photodetector into saturation. This system and method differs from current manual and electrical microwave phase modification by using saturation means for modifying the phase. The system and method may use a plurality of the signal generators for saturating the photodetector.

23 Claims, 9 Drawing Sheets

OTHER PUBLICATIONS

Sun et al.; "Ultrafast transport dynamics of p-i-n photodetectors under high-power illumination." IEEE Photon. Tech. Lett. vol. 10, pp. 135-137, 1998.

Sun et al.; "Ultrafast transport nonlinearity in ultrawide-band long-wavelength p-i-n photodetectors under high illumination" Conference on Lasers and Electro-Optics, 1996, Jun. 2-7, 1996, pp. 9-10.

* cited by examiner

METHOD FOR OPTICAL CONTROL OF MICROWAVE PHASE

This Application claims the benefit of U.S. Provisional Application No. 60/910,230, filed on Apr. 5, 2007, the entirety of which is incorporated herein by reference.

BACKGROUND OF THE INVENTION

1. Field of the Invention

The present invention relates to the field of photonic applications. In particular, the present invention relates to a method and system for controlling the phase of electromagnetic signals.

2. Description of the Related Technology

A variety of photonic applications use photodetectors in analog systems, such as basic optical microwave links, phased arrays and photonic analog-to-digital converters. In these systems, microwave signals are modulated onto optical carriers, transmitted and subsequently received by photodetectors to recover the amplitude and phase. The phase of the microwave signal is influenced by system and environmental parameters, such as path length and dispersion. For example, external compensation for the factors that influence the microwave phase is often accomplished via microwave phase shifters. When using high frequency (20-100 GHz) microwaves, microwave phase shifters produce less than ideal results. Microwave phase shifters also fail to continuously change the phase of the microwave signal.

Analog optical systems with a continuously tunable microwave phase are needed for a wide variety of applications, from photonic analog-to-digital converters to optical microwave links and phased arrays. In order to achieve a large dynamic range, photodetectors with high-saturation currents are necessary. In the 1550-nm wavelength region, wide-bandwidth, InGaAs photodetectors with high photocurrents are made using several designs, among them: dual depletion, uni-traveling carrier, and partially depleted absorber (PDA) photodetectors. Additionally, integrating photodiodes with waveguides (waveguide photodetectors) have shown progress in increasing the photocurrent while maintaining a wide bandwidth.

In each of the above discussed designs, high optical fluence eventually causes nonlinear behavior in the photodetector which ultimately leads to saturation. The leading nonlinear mechanisms include carrier screening of the electric field in the depletion region and band filling. These mechanisms manifest themselves in the photodetector's response by broadening the time response of the resulting electrical waveforms and reducing the photodetector's responsiveness, respectively. To achieve the desired dynamic range over the bandwidth of interest, the detected optical signal must be large enough to provide the necessary signal-to-noise ratio, but must also remain below the saturation level.

Therefore, there is a need in the field to provide an improved method and system for dynamically changing the phase of the microwave signal.

SUMMARY OF THE INVENTION

An object of the present invention can be a system for producing saturation of a photodetector.

Another object of the present invention can be a method for producing saturation of a photodetector.

Yet another object of the present invention can be a method for dynamically controlling the phase of a signal.

Still yet another object of the present invention can be a system for dynamically controlling the phase of a signal.

An aspect of the present invention can be a method for modifying the phase of a signal comprising: providing a photodetector and a first signal generator; transmitting a first signal from the first signal generator to the photodetector; and saturating the photodetector, wherein saturating the photodetector modifies the phase of the first signal.

Another aspect of the present invention can be a system for modifying the phase of a signal comprising: a first signal generator for transmitting a first signal; a photodetector for receiving the first signal; and means for saturating the photodetector, wherein saturating the photodetector modifies the phase of the first signal.

Yet another aspect of the present invention can be a method for modifying the phase of an optical signal comprising: providing a photodetector; providing a first signal generator for generating a first signal; providing a second signal generator for generating a second signal; transmitting a first signal from the first signal generator to a coupler; transmitting a second signal to the coupler; combining the first signal and the second signal to form a combined signal; and transmitting the combined signal to the photodetector, wherein the combined signal saturates the photodetector and modifies the phase of the first signal.

These and various other advantages and features of novelty that characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE PREFERRED EMBODIMENT(S)

The present invention provides a method and system for controlling the phase of a signal. The response of saturated photodetectors was studied and the results employed in order to develop new systems and methods. In particular the effects of saturation on the phase of a microwave signal modulated on an optical carrier were studied. By observing the time-domain response it was possible to simultaneously analyze the high-speed performance in amplitude and phase over a wide bandwidth. The phase performance during saturation was further characterized by using a pulsed signal, such as that from a mode-locked laser, and varying the laser pulse's amplitude and width.

Figure 1:
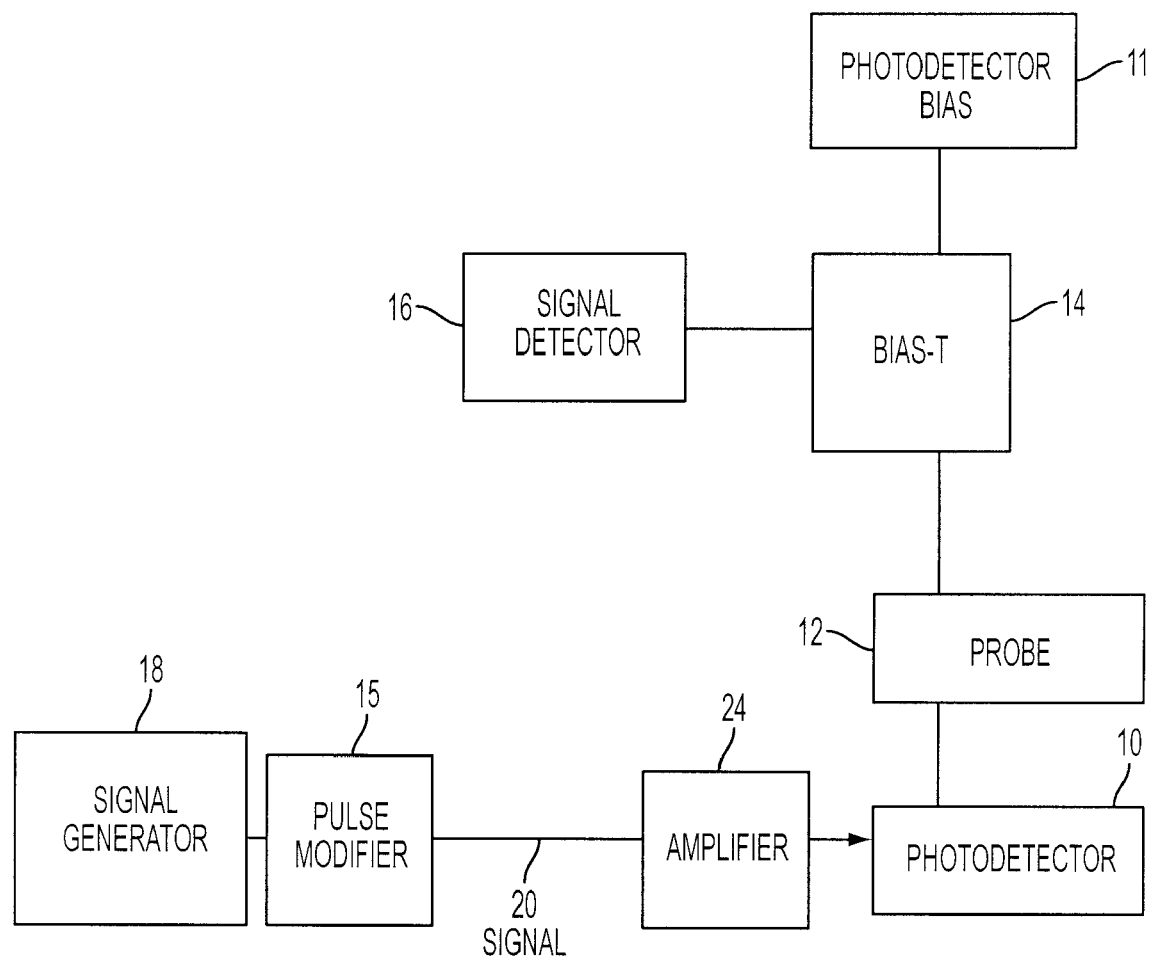
FIG. 1 is a diagram of a system in accordance with an embodiment of the present invention.

In accordance with an embodiment of the present invention, the method performed in the experiments is discussed in reference to the system shown in FIG. 1. A photodetector 10 is used that is a 12 μm diameter, $In_{0.53}Ga_{0.47}As$, p-i-n photodiode. It should be understood that more than one photodetector 10 may be used and/or an array of photodetectors may be employed. Also, the material, structure, and size of photodetector 10 discussed herein is by way of example only and for purposes of employing the method and system, one of ordinary skill would select and use a photodetector of the size, material, and structure needed for the particular system in which it is being used based on common general knowledge. The partially depleted p-i-n structures located on photodetector 10 have a three-section graded 350-nm p-region of 100 nm, 100 nm, and 150 nm thicknesses, with $2 \times 10^{18}$ cm$^{-3}$, $1 \times 10^{-} $cm$^{-3}$, and $0.5 \times 10^{18}$ cm$^{-3}$ Be doping, respectively. The i-region is 250 nm followed by a 250 nm InP n-region (Si: $5 \times 10^{18}$ cm$^{-3}$), followed by a 750-nm thick n+ region (Si: $10^{19}$ cm$^{-3}$), with an InP p-cap layer.

Electrical contact to photodetector 10 is accomplished with a probe 12, which in this embodiment is a DC to 67-GHz microwave probe, Picoprobe™ 67A-GS-50-DP. Probe 12 is connected through a bias-T 14, which in this embodiment is a Wiltron™ V250 bias-T, to a Keithley™ 2400 sourcemeter for photodetector bias 11 and measurements. The microwave output of the bias-T 14 is connected to a signal detector 16, which in this embodiment is a Tektronix™ SD-32 50 GHz sampling head for high-speed, time-domain measurements. The DC current-voltage measurements of the photodetector demonstrates a 10 nA dark current at 2V bias and <1 ohm series resistance.

Photodetector 10 is backside illuminated through the InP substrate. A signal generator 18 is used, which in this embodiment is a mode-locked fiber laser. This signal generator 18 produced 2.1 ps, 1.2 nm transform-limited sech$^2$ pulses at a center wavelength of 1546 nm with a 1 GHz repetition rate. It should be understood that the signal generator 18 may produce electromagnetic radiation of any wavelength and is not limited to any one particular wavelength or frequency range. It should also be understood that it is possible to use a signal generator that can operate as either a pulsed laser and/or a continuous wave laser plus microwave signal/data/information modulation. The laser modulation could also contain the amplitude and/or width modulation for phase control in some embodiments.

In the embodiment shown in FIG. 1, a pulse modifier 15 may be operably connected to signal generator 18, or part of the construction of signal generator 18, and used to control pulse width and/or amplitude. Signal generator 18 produces a signal 20, which is a carrier signal that may contain data. As discussed above, signal 20 may be commonly referred to as an "optical signal", and in particular, within this application reference is made to microwave signals modulated onto this optical signal. However, it is intended and implied in discussing the signal 20 that it is not limited to any particular wavelength or frequency. Usage of the terminology "signal," "optical signal," or "optical" in the present application is intended to cover any signal formed with electromagnetic radiation and is not limited to any particular wavelength or frequency. It should also be understood that signal generator 18 may be a pulsed laser or a modulated continuous wave laser and/or a combination of the two. It should also be understood that photodetector 10 is intended to represent a detector at any electromagnetic frequency.

Using this system, tests were performed with direct laser output from signal generator 18 in transmitting a signal 20, as well as sending signal 20 through the pulse modifier 15, in this case two lengths of high-dispersion (HD) fiber, enabling 2.1 ps, ~20 ps, and ~55 ps pulses (3.2 ps, 30 ps, and 85 ps autocorrelation pulses). It should be understood that signal generator 18 may transmit the signal 20 to photodetector 10 via any operable means, such as fiber optic cable, through atmosphere, etc. The pulse trains of signal 20 can be amplified by an optical amplifier 24 and then focused onto the 12 μm photodetector 10. A pulse modifier 15 may also be used in order to vary all pulse parameters of signal 20. Optical amplifier 24 assists in the transmission of signal 20, but is an optional feature of the system. In the example, the average optical power was varied from 0.4 to 32.0 mW which provided 0.4 to 32.0 pJ optical pulses. Testing with a Continuous Wave (cw) source with the same average power was performed for comparison.

Figure 2A:
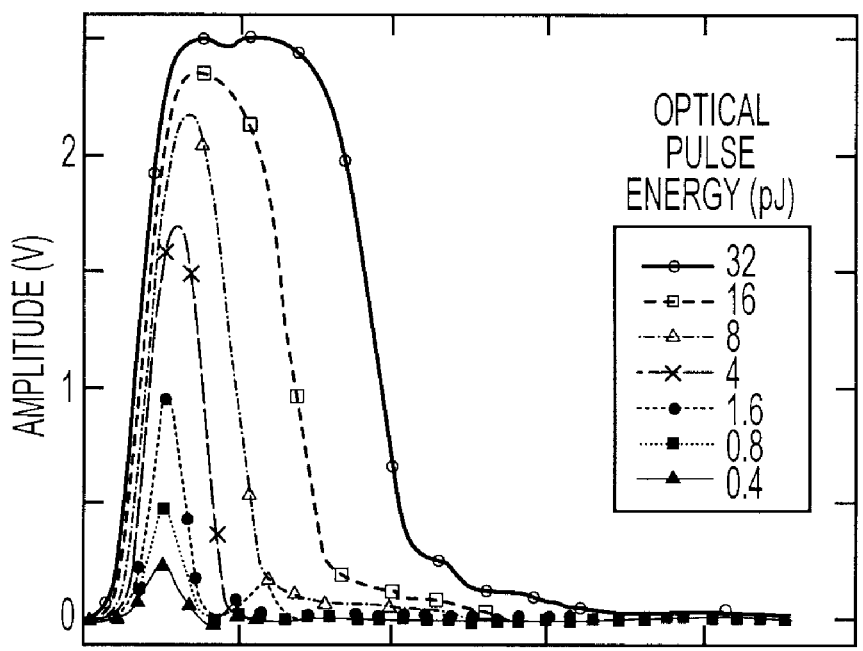
FIG. 2(a) shows a graph of the response of a 12 µm photodetector to 0.4 to 32 pJ pulses of a ~20 ps FWHM.

Now referring to FIG. 2a, a graph of the response of the 12 μm photodetector 10 shown in FIG. 1 is shown, with a 2-V reverse bias, excited by optical pulses ranging from 0.4 to 32 pJ. As optical excitation of photodetector 10 increases, FIG. 2a illustrates two effects: 1), the electrical pulse increases in height, and 2), the pulse's width and fall-time both increase.

Photodetector 10 saturates when excited with optical pulses ranging from 1 to 5 pJ. As photodetector 10 begins to saturate, the amplitude of the pulse peak reaches a limiting value of ~2.5 V, and the pulse broadens. At high intensity the falling edge of the pulse is composed of two functions: a fast decay (<100 ps), and a slow decay (>100 ps). By driving photodetector 10 into saturation, the electrical pulse's centroid moves later in time.

Figure 2B:
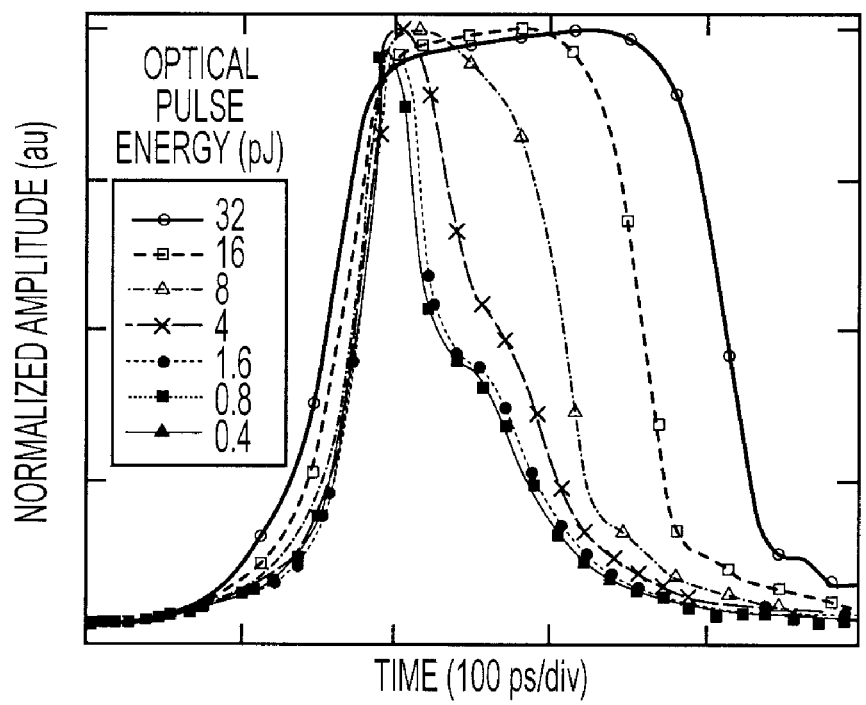
FIG. 2(b) shows a graph of the response of a 12 µm photodetector to 0.4 to 32 pJ pulses of a ~55 ps FWHM.

When normalizing the data shown in FIG. 2a, as is done in FIG. 2b, the rising edge of the pulse moves to an earlier time than in the unsaturated case. To this effect on the pulse timing, the much larger delay due to pulse broadening and pulse decay processes are added, which pushes the pulse's centroid to a later time. Photodetector 10 has a bandwidth that is limited by the capacitance of the diode. For the 12 μm photodetector 10, the capacitance is 42 fF resulting in a 3 dB bandwidth of 45 GHz. The response of photodetector 10 is therefore the limiting factor of the high-speed, time-domain measurements. The impulse response of the system is obtained by exciting the photodetector 10 with a 0.4 pJ, 2.1 ps optical pulse, producing a 9.5 ps rise time and 13.6 ps full-width at half maximum (FWHM). Excitation with 0.4 pJ and ~20 ps pulses produce an 18 ps rise and fall time along with a 21.5 ps FWHM, while the ~55 ps pulses show a 54-ps rise time, 120-ps fall time, and a 54 ps FWHM. A comparison of the 2.1-ps optical pulse excitation with that of both the 20 ps and 55 ps pulses demonstrates that the measurement system is limited in the former case but not for the latter (20 ps and 55 ps) pulses.

To quantify the behavior of the observed photodetector 10, a one-dimensional (1D) time-domain drift-diffusion model and Poisson's equation is solved numerically in a self-consistent manner. The small size of photodetector 10 effectively removes lateral-transport effects. The lattice temperature in the InGaAs region is calculated using a 3D radially symmetric solution of the heat diffusion equation. Spatial variation in the fitted velocity-field relations is incorporated into the model, along with the reduction of the absorption by band filling at high pump intensities. The variation of the applied bias with the current flow through the device (using a series resistance of 2Ω) is also included. The results are shown for several pulse energies (assuming 20-ps pulses) in FIG. 3.

Figure 3:
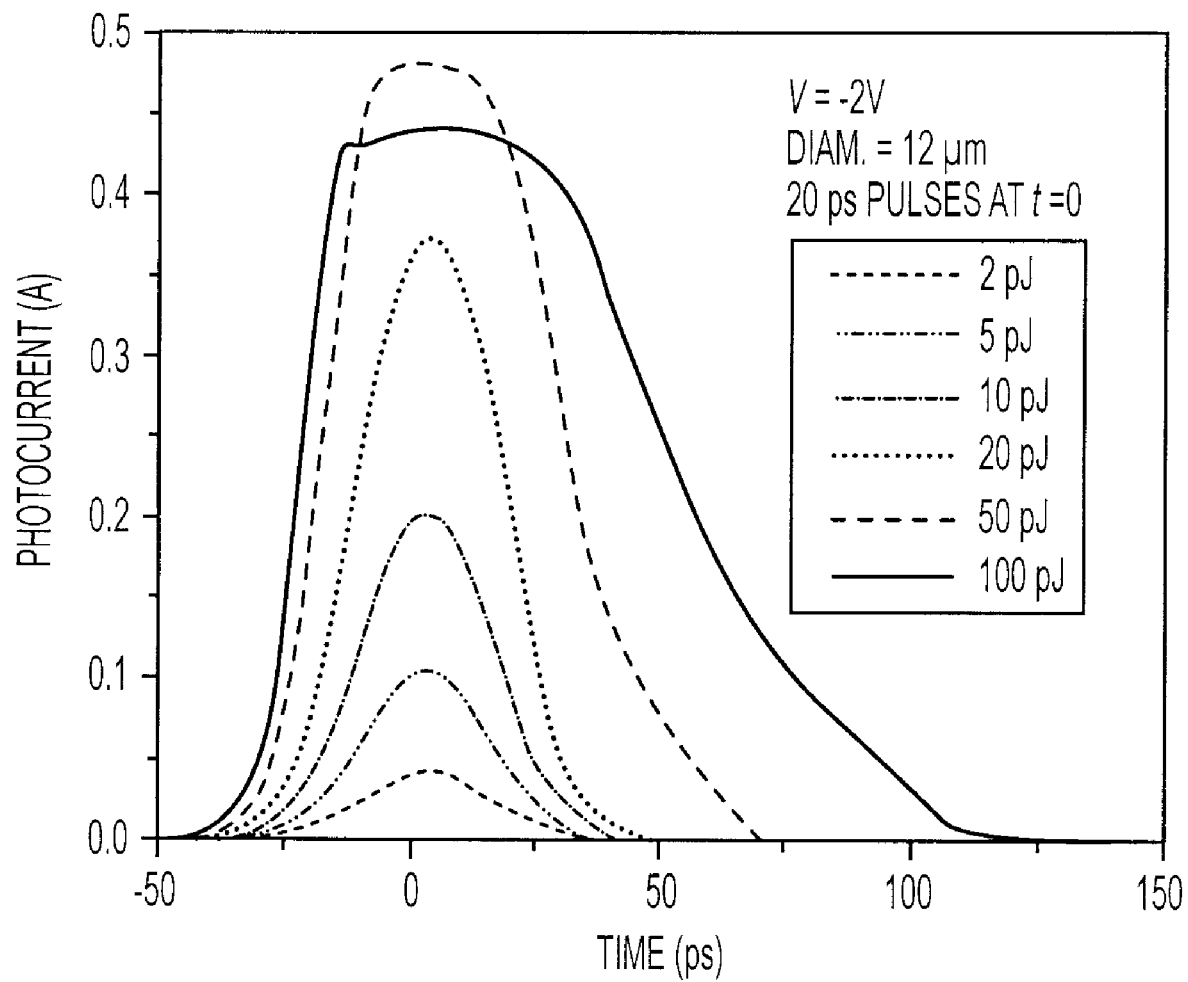
FIG. 3 is a graph showing photocurrent v. time of a PDA photodetector.

The graph shown in FIG. 3 reproduces the effect of pulse broadening and saturation. Modeling reveals that the pulse broadening occurs mostly as a result of the dramatic field screening in the intrinsic region of photodetector 10 due to the spatial separation of the photogenerated electrons and holes. The saturation of the photocurrent is a combined effect of the field screening, carrier velocity reduction due to heating, the reduced absorption, and a lower bias over the active region due to the non-zero series resistance. The second decay time at the highest pulse energies is primarily due to the slow diffusion from the doped regions.

Figure 4A:
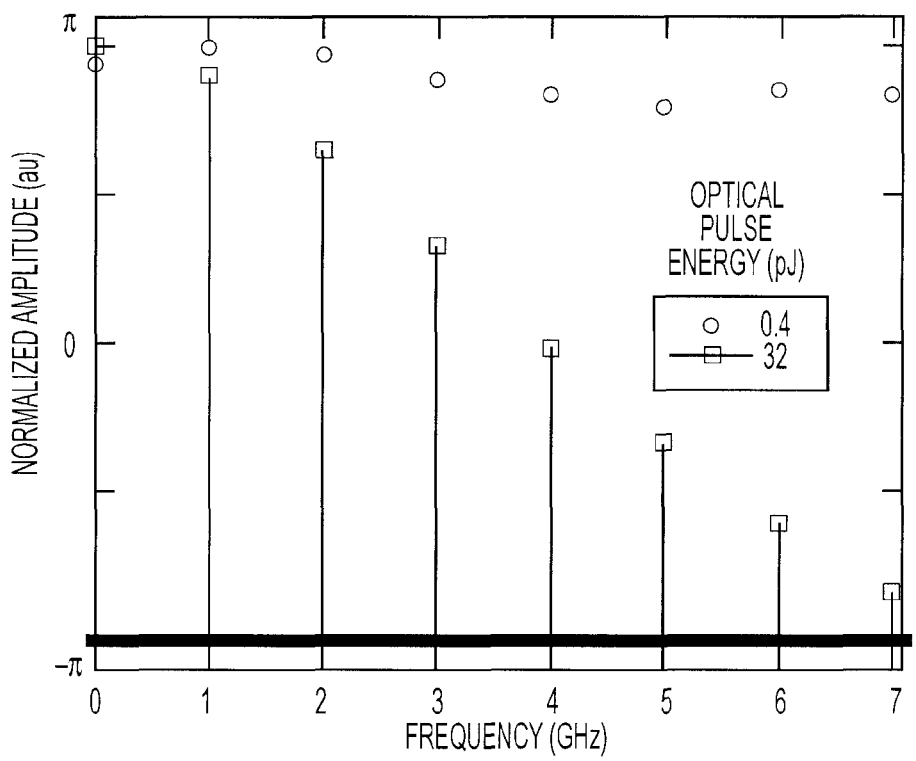
FIG. 4(a) is Fast Fourier transform of 2.1 ps pulsed data showing the normalized amplitude.

In order to examine the frequency dependence of pulse saturation, a fast Fourier transform is applied to the time-domain data. A comparison of optical fluence data for 2.1-ps excitation is shown in FIG. 4a. Since the detected signal is an electrical pulse train, the Fourier transform is a series of harmonics at the repetition frequency of the pulses. As photodetector 10 is saturated, the spectral content of the pulse shifts towards the fundamental frequency, as can be seen in FIG. 4a. This shift causes an increase in the power of the fundamental frequency at the expense of a loss of power at higher frequencies.

Figure 4B:
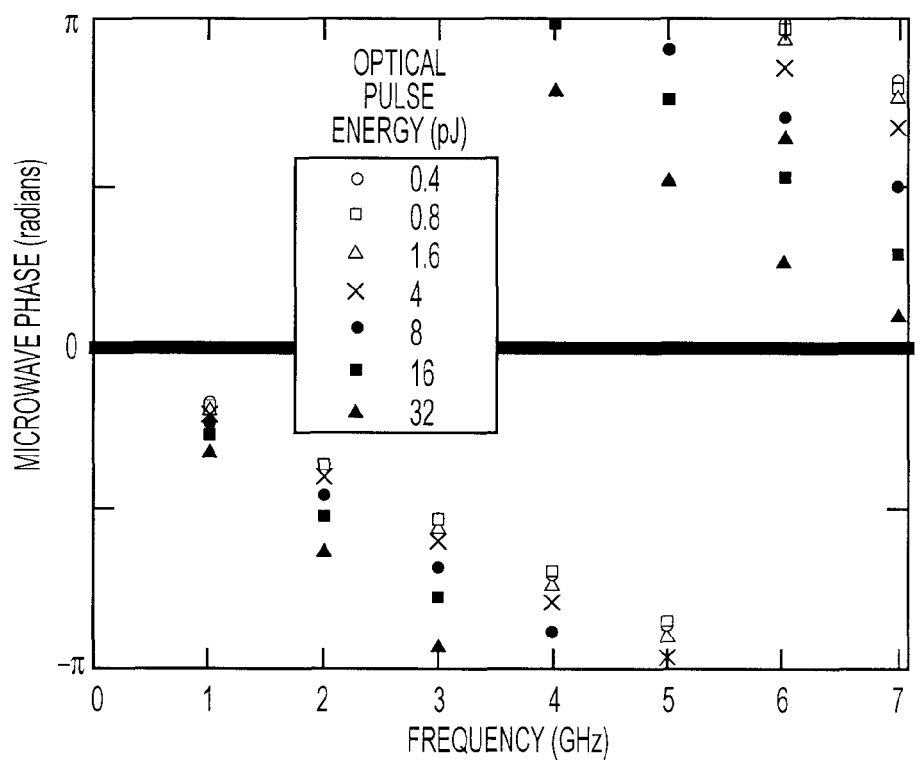
FIG. 4(b) Fast Fourier transform of 2.1 ps pulsed data showing the phase response for several incident pulse energies.

The changing phase of the pulse train is shown in FIG. 4b. All frequency modes are observed to experience a monotonic change in phase as optical power is increased. The magnitude of this change is smallest for the fundamental frequency and increases with increasing harmonic frequency. When the input energy is increased from 0.4 to 32 pJ, the change in phase of the fundamental frequency and second harmonic is 0.45 and 0.82 radians, respectively. Similar phase changes are reflected for the 20 ps and 55 ps optical pulses. For longer pulses the effect is similar to that for short pulses.

Figure 5:
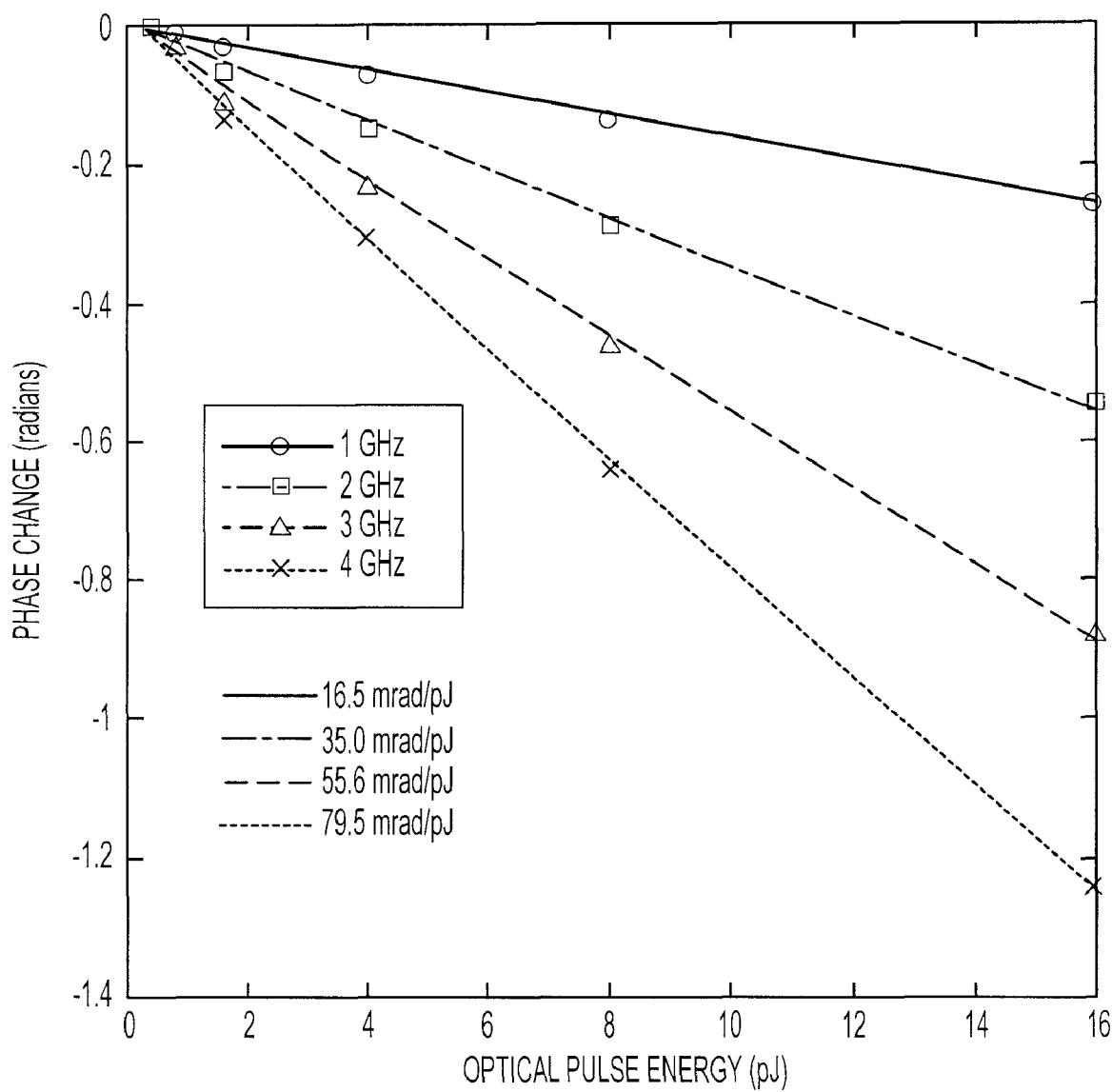
FIG. 5 is a graph showing the change in phase of the fundamental and harmonics of the electrical signal from a photodetector driven by a ~55-ps, 1 GHz pulse train as the pulse energy drives the photodetector into saturation.

In order to examine the electrical phase change as a function of applied optical energy, the pulse energy versus phase change is plotted in FIG. 5 for the fundamental frequency and for several harmonics. The phase change is linear up to ~16 pJ pulse energies. Even though the data for 32 pJ is not shown in FIG. 5, the incremental phase change is reduced and begins to deviate from the linear prediction.

The linear curve fit in FIG. 5 shows the phase/pulse-energy slopes for each harmonic. The harmonic frequencies have a slope that is almost exactly their harmonic number times the slope of the fundamental. The increase in slope of the harmonics is to be expected since this effect produces a time shifting of the pulse centroid. Therefore the same time shift at a higher frequency produces a proportionally larger phase shift.

The phase change at the signal detector 16 due to saturation of photodetector 10 permits phase control within a photonic system and is the result of the modification of the optical power on photodetector 10. The amplitude/width to phase conversion is produced by the waveform from signal generator 18 or produced by pulse modifier 15 operably connected to signal generator 18 in order to remotely modify the detected phase.

Another way of saturating photodetector 10 is via modulation of the bias voltage of photodetector 10. The saturation is accomplished by photodetector bias 11. This can permit photodetector 10 to operate as both a mixer and detector.

Saturation of photodetector 10 can also produce an unwanted effect since amplitude noise can be converted into phase noise if the saturation effects are significant. Phase noise and timing jitter of signals should be kept small in order to maintain accuracy and dynamic range in photonic systems. For example, an optical pulse train incident on a photodetector that is just beginning to saturate having a 1% change in the optical amplitude changes the phase of the fundamental by 0.66 mrad, when using the linear relationship from FIG. 5. This produces a 0.01% retardation in timing at 1 GHz or a 100 fs jitter in time. If the 10th harmonic were used, or similarly if a 10 GHz pulse train of these pulses were used, a ten-fold increase in phase of the fundamental frequency would occur causing a 6.6 mrad phase shift, resulting from that 100-fs fluctuation in time. Timing jitter of 100 fs for a 10 GHz oscillator is more than 10 times greater than has been demonstrated with mode-locked lasers and can severely limit its applications in photonic systems such as analog-to-digital converters, optical metrology, and microwave generation.

Another method and system, in accordance with an embodiment of the present invention, for dynamically changing the phase of signal 20 in photodetector 10 is via the addition of a second signal generator 19, such as a laser, into the system. A second signal generator 19 operates, using a second signal 21, to control the saturation level of photodetector 10, and thereby modifying the detected phase of signal 20.

As discussed above, the phase performance of photodetector 10 during saturation can be characterized using a pulsed signal generator 18 and varying the pulse's amplitude. Increasing the optical pulse energy causes saturation and shifts the resulting pulse's centroid later in time. This has the effect of retarding the detected phase, producing an amplitude modulation to phase modulation converter. This effect can be employed in order to control the phase of signal 20, such as a microwave signal in an analog photonic link.

Figure 6:
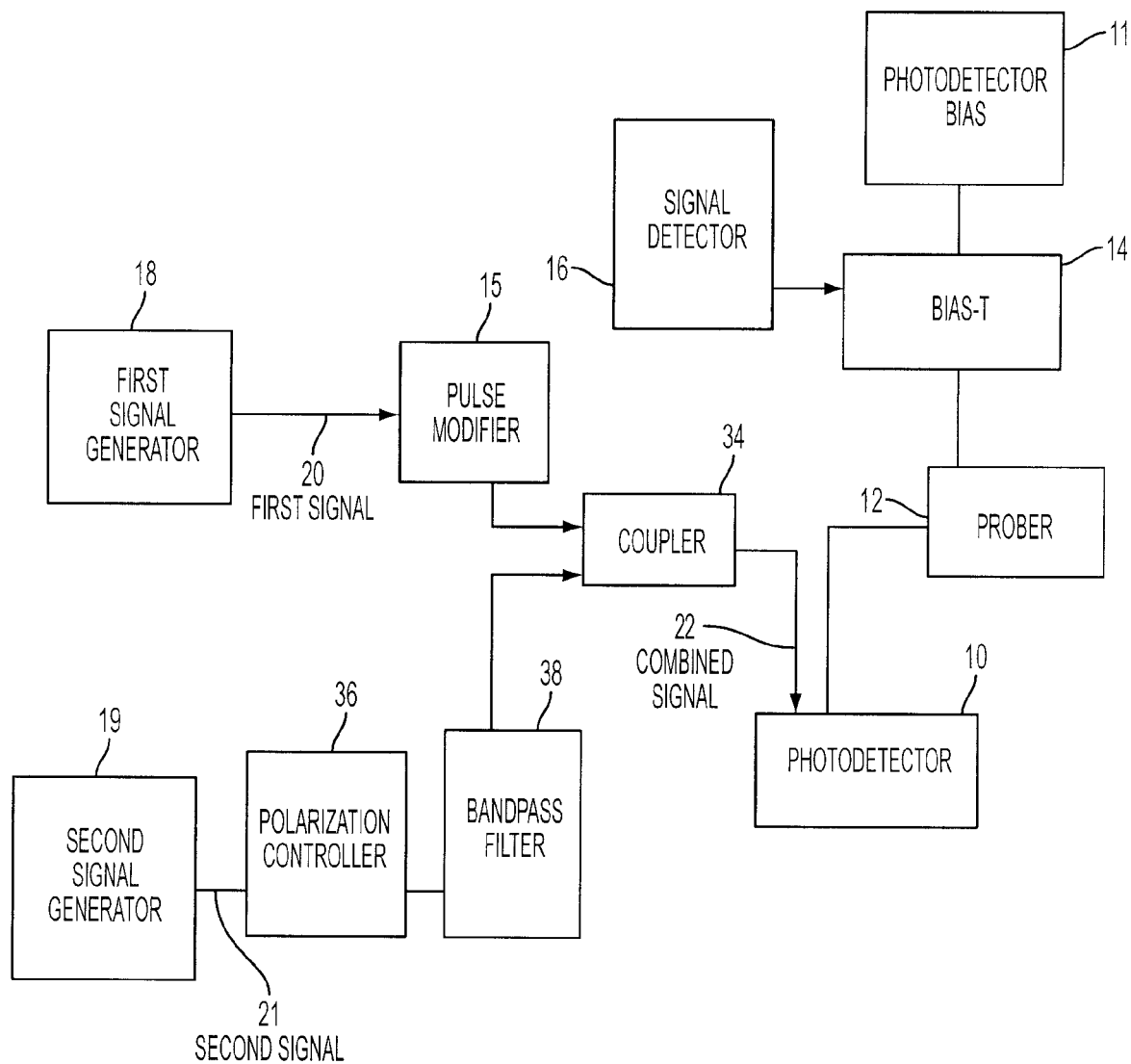
FIG. 6 is a diagram of a system for the controlling of the phase of a signal using two signal generators, in accordance with an embodiment of the present invention.

FIG. 6 is a diagram illustrating an embodiment of the present invention utilizing two signal generators, 18, 19. It should be understood that more than two signal generators can be employed so long as the resultant combined signal saturates photodetector 10 as desired for altering the microwave phase. It should also be understood that use of more than one signal generator is for ease of explanation. Second signal generator 19 is unnecessary since a single pulse modifier 15 could modulate the signal 20 so that it acts as both the carrier signal and the phase control signal, providing a simple retrofit into current photonic systems.

In the example discussed herein and in reference to FIG. 6, signal generators, 18, 19 are two Alcatel™ A1905 laser diodes. First signal generator 18 is used as the optical carrier of the microwave signal and second signal generator 19 is used to optically bias photodetector 10. The signal path is comprised of first signal 20, which is a 1552-nm optical carrier signal that is sent through a pulse modifier 15 and/or can be sent through an electro-optic intensity modulator (EOM), which can be a JDS™ electro-optic intensity modulator, and can be driven at +5 dBm by an analyzer, which can be an Agilent™ 8720 network analyzer.

First signal 20 is coupled in a 50/50 coupler 34 with second signal 21 transmitted from second signal generator 19. A second pulse modifier (not shown) could be placed after the second signal generator 19 in order to modify the second signal 21. Although a coupler 34 is shown in FIG. 6, one of ordinary skill in the art would be familiar with different ways of combining first signal 20 and second signal 21. Second signal 21 can be comprised of a 1557 nm source sent through a polarization controller 36 and bandpass filter 38, which in this embodiment may be a 2 nm tunable bandpass filter. Bandpass filter 38 and polarization controller 36 are optional in the operation of the system, but they reduce the possibility of interference between first and second signals 20, 21.

First signal 20 and second signal 21 are coupled to form a combined signal 22 that excites photodetector 10, which in this embodiment can be a Fermionics™ SMA-OC photodetector. Photodetector 10 may be voltage biased and have operably connected to it a bias-T 14. In the embodiment shown in FIG. 6, bias-T 14 is a Picosecond Pulse Laboratory™ bias-T, and connects to a photodetector bias 11, which is a Keithley™ 2400 source/meter, and a microwave signal detector 16. A microwave signal from the photodetector 10 passes through the port of bias-T 14 and is terminated by a microwave signal detector 16.

Figure 7:
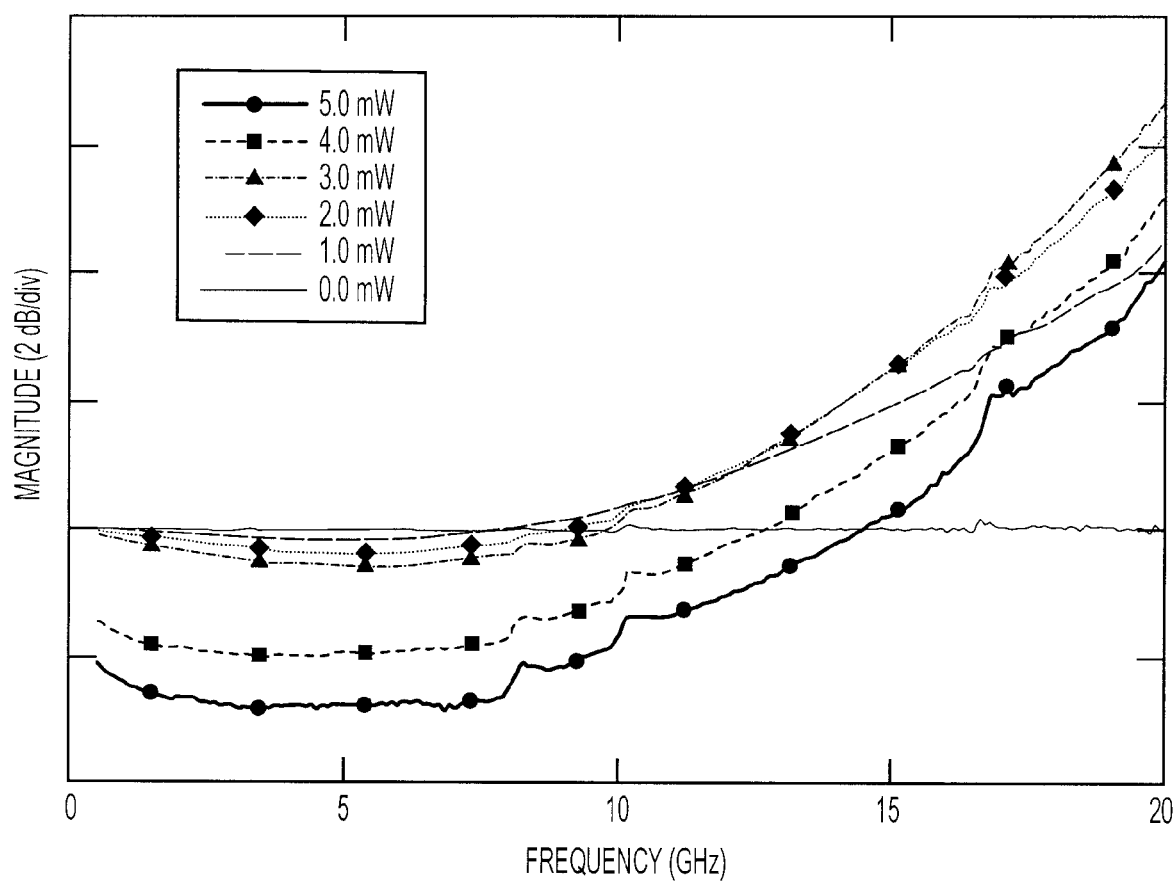
FIG. 7 is a graph showing the change in magnitude of the photodetector response for second signal control powers of 0 to 5 mW.
Figure 8:
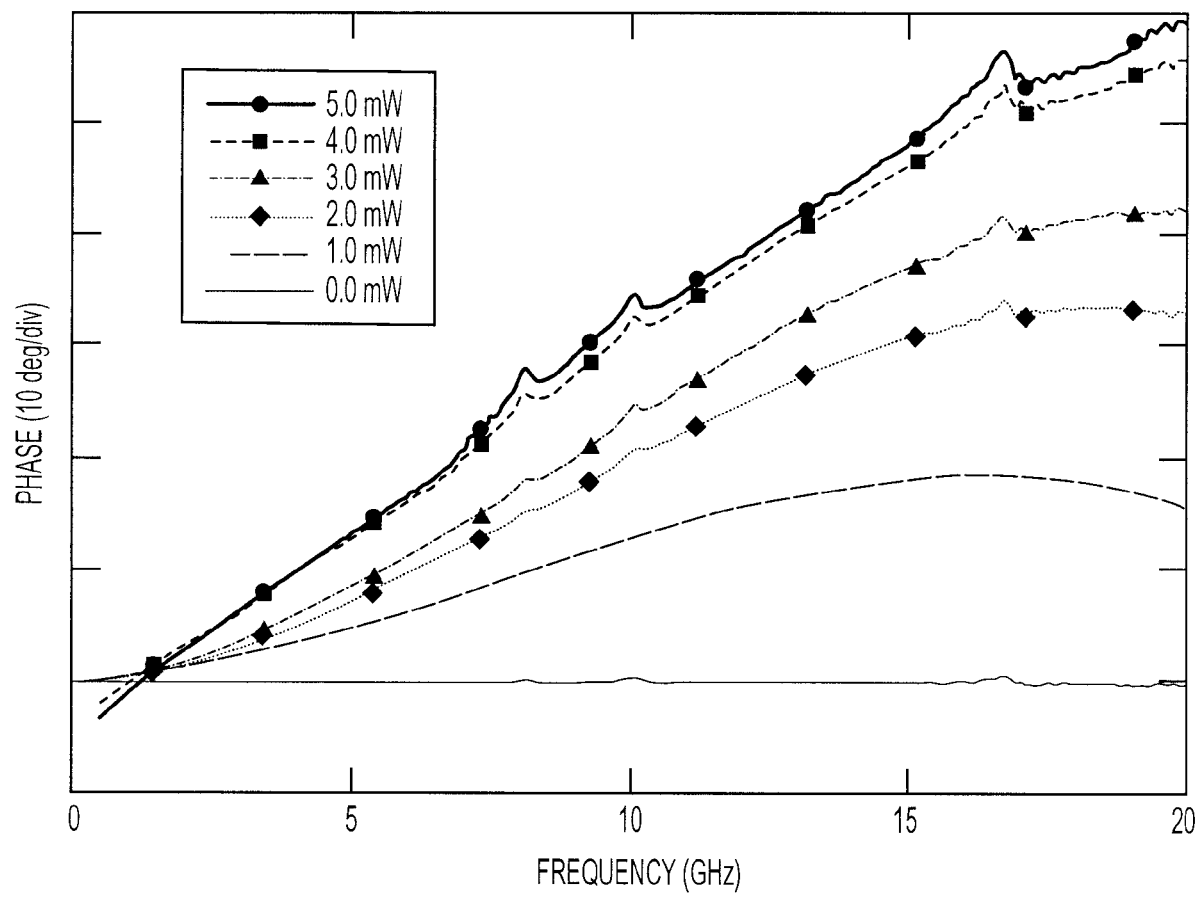
FIG. 8 is a graph of the change in phase response of the photodetector for second signal control powers from 0 to 5 mW.

Now turning to FIGS. 7 and 8, the results obtained by using the system shown in FIG. 6 are discussed below in the example. The power at photodetector 10 of first signal 20 was set to an average power of 1.0 mW. The power of second signal 21 was varied between 0 and 5 mW, as measured at the photodetector 10. FIGS. 7 and 8 show the magnitude and phase response of the photonic link from 0.5 to 20 GHz with the photodetector biased at −6 Volts. The traces were normalized to the response of photodetector 10 in the absence of a second signal generator 19. For all optical power levels the DC responsivity of the photodiode was 1.09 A/W.

In FIG. 7, the magnitude of the response of photodetector 10 from 1 to 10 GHz stays constant to within 1 dB as second signal 21 is increased from 0 to 3 mW. At 4 and 5 mW of control power from the second signal 21, the response was degraded by ~2 dB. From 10 to 20 GHz, however, a more interesting phenomenon is observed. Here the magnitude is enhanced by up to 6 dB as the power of second signal 21 is increased.

The graph shown in FIG. 8 illustrates the phase of first signal 20 having a continuous increase as the power of second signal 21 varies from 0 to 5 mW. The amount of phase shift induced by second signal 21 increases with increasing frequency. At 5 GHz and 10 GHz there is a 13 and 34 degree maximum shift (respectively), while at 20 GHz the maximum phase shift is 59 degrees.

The phase shift is due to saturation of photodetector 10, as discussed above in discussing the use of pulsed lasers. This effect can extend to much higher frequencies. In the pulsed measurement, saturation caused a shift in the pulse centroid, thereby changing the phase of first signal 20. This effect is therefore a time shift, and as such, it will cause a larger phase change at higher frequencies. This qualitatively explains the phase results shown in FIG. 8.

The example demonstrates the ability to continuously change the phase of signal 20 in a photonic link by varying the power on photodetector 10. The implementation of this requires a minimal amount of extra components.

Figure 9:
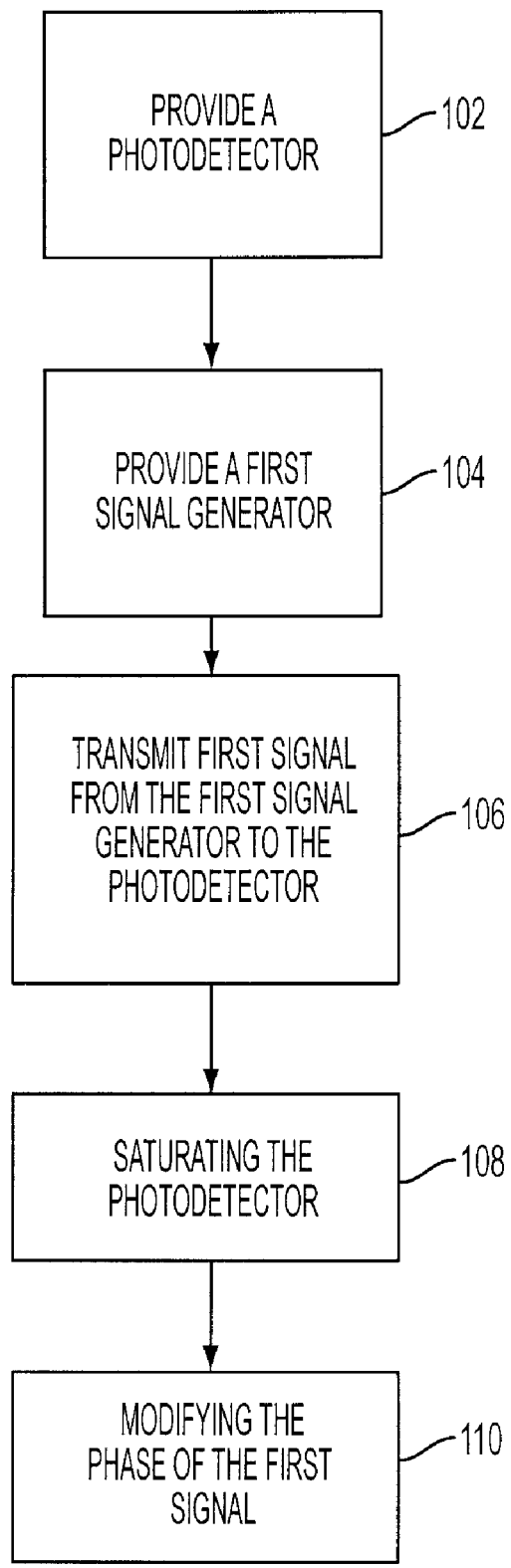
FIG. 9 is a flow chart showing the method for controlling phase of a signal.

Now turning to FIG. 9, a flow chart is provided showing an overview of the basic method steps employed in providing control of the phase of a signal 20. In step 102, a photodetector 10 is provided, as discussed in detail above. At step 104 a first signal generator 18 is provided that produces first signal 20, as discussed in more detail above. At step 106, first signal 20 from first signal generator 18 is transmitted to photodetector 10. At step 108, photodetector 10 is saturated. Saturation of photodetector 10 can be accomplished by any of the various saturation means discussed above, such as varying the signal amplitude and/or width, varying the photodetector bias, providing additional signal generators, and/or modulating the signal to produce both a carrier and control signal. At step 110 saturation of photodetector 10 is used to modify the phase of signal 20.

The effects produced by the method and system, discussed in detail above, are stronger at higher frequencies. This method can make a low-loss contribution to dynamic phase modification. Applications are in areas such as phased arrays. The method may be employed to provide dynamic steering changes that can be performed rapidly and remotely with electro-optic modulators. The method and system can be employed in systems for compact, and robust design for operation up to high-frequencies (>100 GHz).

Some advantages of the new system and method are that it enables operation at higher speeds than commercial microwave phase shifters. Another advantage is that it allows continuous tuning of the phase (rather than the discrete phase steps used in conventional microwave phase shifters). There is reduced loss in the signal since no additional microwave elements are needed and current microwave phase controlling devices can be eliminated. This provides improvements in SNR and photonic link distance.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A method for modifying phase of a signal comprising:
providing a photodetector and a first signal generator;
transmitting a first signal from the first signal generator to the photodetector; and
saturating the photodetector, wherein saturating the photodetector modifies the phase of the first signal.

2. The method of claim 1, wherein the saturating step comprises providing a second signal generator, wherein the second signal generator transmits a second signal to the photodetector.

3. The method of claim 2, wherein the saturating step further comprises coupling the first signal and the second signal to form a combined signal.

4. The method of claim 3, wherein the combined signal is transmitted to the photodetector.

5. The method of claim 1, wherein the saturating step comprises varying pulse width or amplitude of the first signal.

6. The method of claim 5, wherein varying the pulse width or amplitude of the first signal is performed using a pulse modifier.

7. The method of claim 1, wherein the saturating step comprises changing electrical bias of the photodetector.

8. The method of claim 1, wherein the saturating step comprises modulating the first signal at the first signal generator.

9. The method of claim 1, wherein the modification of the phase of the first signal is dynamic and continuous.

10. The method of claim 1, wherein the first signal is a microwave signal phase modulated on an optical carrier.

11. The method of claim 1, wherein said first signal is a microwave signal phase modulated on an optical carrier, and wherein signal generator includes a mode locked laser generating an optical carrier signal and a pulse modifier adapted to impress the microwave signal onto the optical carrier.

12. A system for modifying phase of a signal comprising:
a first signal generator for transmitting a first signal;
a photodetector for receiving the first signal; and
means for saturating the photodetector, wherein saturating the photodetector modifies the phase of the first signal.

13. The system of claim 12, wherein the saturation means comprises a second laser wherein the second laser transmits a second optical signal for saturating the photodetector.

14. The system of claim 13, wherein the saturation means further comprises a coupler for coupling the first signal and the second signal to form a combined signal.

15. The system of claim 14, wherein the combined signal is transmitted to the photodetector.

16. The system of claim 12, wherein the saturation means comprises a pulse modifier for varying pulse amplitude or width of the first signal.

17. The system of claim 12, wherein the saturation means comprises a bias for changing electrical bias of the photodetector.

18. The system of claim 12, wherein the saturation means comprises a modulating means for modulating the first signal at the first signal generator.

19. A method for modifying phase of a signal comprising:
transmitting a first optical signal generated by a first signal generator to a coupler;
transmitting a second optical signal generated by a second signal generator to the coupler;
combining the first signal and the second signal to form a combined optical signal; and
transmitting the combined signal to a photodetector, wherein the combined signal saturates the photodetector and modifies the phase of an output electrical signal from the photodetector with respect to of the first signal.

20. The method of claim 19, wherein the modification of the first signal is dynamic and continuous.

21. A method for modifying the phase of a signal comprising:
providing a photodetector and a first optical signal generator;
transmitting a first optical signal from the first optical signal generator to the photodetector with photons of said first optical signal incident on said photodetector;
said photodetector operating in saturation; and
said photodetector producing an output electrical signal having a modified phase with respect to the phase of the first optical signal.

22. The method of claim 21, wherein the first optical signal is a microwave signal phase modulated on an optical carrier.

23. The method of claim 21, further comprising:
providing a second optical signal generator;
transmitting a second optical signal from the second signal generator; wherein said photons in said first optical signal and said second optical signal saturate the photodetector.

* * * * *